United States Patent
Hua et al.

(10) Patent No.: US 11,282,633 B2
(45) Date of Patent: Mar. 22, 2022

(54) DEVICE WITH OUT-PLANE INDUCTORS

(71) Applicant: Intel Corporation, Santa Clara, CA (US)

(72) Inventors: Fay Hua, Fremont, CA (US); Sidharth Dalmia, Fair Oaks, CA (US); Zhichao Zhang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 16/616,387

(22) PCT Filed: Jun. 28, 2017

(86) PCT No.: PCT/US2017/039648
§ 371 (c)(1),
(2) Date: Nov. 22, 2019

(87) PCT Pub. No.: WO2019/005026
PCT Pub. Date: Jan. 3, 2019

(65) Prior Publication Data
US 2020/0082969 A1    Mar. 12, 2020

(51) Int. Cl.
*H01F 27/28* (2006.01)
*H01F 41/04* (2006.01)
(Continued)

(52) U.S. Cl.
CPC ....... *H01F 27/2804* (2013.01); *H01F 41/046* (2013.01); *H01L 21/4853* (2013.01);
(Continued)

(58) Field of Classification Search
CPC .... H01F 27/2804; H01F 41/046; H01F 27/28; H01F 41/04; H01F 2027/2814;
(Continued)

(56) References Cited

U.S. PATENT DOCUMENTS 8,093,982 B2    1/2012 Kim et al.
9,527,723 B2 *  12/2016 Lin ........................ B81B 7/007
(Continued)

FOREIGN PATENT DOCUMENTS

KR    10-2012-0132572    12/2012

OTHER PUBLICATIONS

International Preliminary Report on Patentability notified Jan. 9, 2020 for PCT Patent Application No. PCT/US2017/039648.
(Continued)

*Primary Examiner* — Alexander O Williams
(74) *Attorney, Agent, or Firm* — Essential Patents Group, LLP.

(57) ABSTRACT

An apparatus is provided which comprises: a planar dielectric surface, two or more conductive leads on the surface, the conductive leads extending away from the substrate surface, two or more conductive traces on the surface between the conductive leads, the traces substantially parallel to each other, and a wire coupling a first end of a first conductive trace to an opposite end of an adjacent second conductive trace, the wire extending away from the surface. Other embodiments are also disclosed and claimed.

19 Claims, 6 Drawing Sheets

(51) Int. Cl.
*H01L 21/48* (2006.01)
*H01L 23/498* (2006.01)
*H01L 23/522* (2006.01)
*H01L 23/58* (2006.01)
*H01L 23/00* (2006.01)

(52) U.S. Cl.
CPC .... *H01L 23/49816* (2013.01); *H01L 23/5227* (2013.01); *H01L 23/58* (2013.01); *H01L 24/11* (2013.01); *H01L 24/43* (2013.01); *H01L 24/48* (2013.01); *H01L 24/49* (2013.01); *H01F 2027/2814* (2013.01); *H01L 24/14* (2013.01); *H01L 2224/45139* (2013.01); *H01L 2224/45144* (2013.01); *H01L 2224/45147* (2013.01); *H01L 2224/4813* (2013.01); *H01L 2224/48091* (2013.01); *H01L 2224/49175* (2013.01)

(58) Field of Classification Search
CPC ............... H01F 24/49; H01L 21/4853; H01L 23/49816; H01L 23/5227; H01L 23/58; H01L 24/11; H01L 24/43; H01L 24/48; H01L 24/49; H01L 24/14; H01L 2224/45139; H01L 2224/45144; H01L 2224/45147; H01L 2224/48091; H01L 2224/4813; H01L 2224/49175
USPC ........................................................ 257/531
See application file for complete search history.

(56) References Cited

U.S. PATENT DOCUMENTS

| | | | |
|---|---|---|---|
| 2010/0264533 A1 | 10/2010 | Chen | |
| 2011/0215891 A1 | 9/2011 | Sundstrom et al. | |
| 2015/0054573 A1* | 2/2015 | Zhou | H01L 23/645 327/540 |
| 2016/0379752 A1* | 12/2016 | Gardner | H01F 29/146 336/155 |
| 2020/0227401 A1* | 7/2020 | Elsherbini | H01L 24/14 |
| 2020/0286745 A1* | 9/2020 | Elsherbini | H01L 21/4871 |
| 2021/0050300 A1* | 2/2021 | Lin | H03K 19/0016 |
| 2021/0111088 A1* | 4/2021 | Jain | H01L 23/5386 |
| 2021/0143060 A1* | 5/2021 | Hollis | H01L 24/06 |

OTHER PUBLICATIONS

International Search Report and Written Opinion for International Patent Application No. PCT/US17/39648, dated Mar. 21, 2018.
Shirakata, et al., "High Permeability and Low Loss Ni—Fe Composite Material for High-Frequency Applications", IEEE Transactions on Magnetics, vol. 44, No. 9, Sep. 2008.

* cited by examiner

DEVICE WITH OUT-PLANE INDUCTORS

CLAIM OF PRIORITY

This Application is a National Stage Entry of, and claims priority to, PCT Application No. PCT/US17/39648, filed on Jun. 28, 2017 and titled "DEVICE WITH OUT-PLANE INDUCTORS", which is incorporated by reference in its entirety for all purposes.

BACKGROUND

ROM Integrated circuit device package solutions may include inductors integrated into a dielectric surface on the die side and/or the land side for power delivery and/or signal integrity. However, the on-plane integrated inductors can be constrained by dielectric and metal material processes that could make achieving sufficiently high inductance values more difficult. Also, as devices and packages continue to shrink in size, effects of eddy currents within a device package could create signal integrity problems, for example. Removing inductors from device packages and placing them nearby on the associated printed circuit board would tend to complicate and increase board space requirements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Integrated circuit devices with out-plane inductors are generally presented. In this regard, embodiments of the present disclosure enable out-plane inductors that previously may have been located within a planar dielectric surface. One skilled in the art would appreciate that these out-plane inductors may enable higher inductance values while lessening issues caused by eddy current. Additionally, out-plane inductors may provide better use of previously vacant space while being able to limit overall z-height of a system, which may be an important consideration in certain applications.

As used herein, an out-plane inductor refers to any inductor with at least one non-planar aspect or feature. As such, an out-plane inductor need not look exactly like the examples shown or described herein and the term is not intended to be so limited. For example, an out-plane inductor may have a combination of planar and non-planar coils without deviating from the teachings of the present disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom:" "over," "under," and the like in the description and in the claims, if any, are used for descriptive purposes and not necessarily for describing permanent relative positions.

Figure 1:
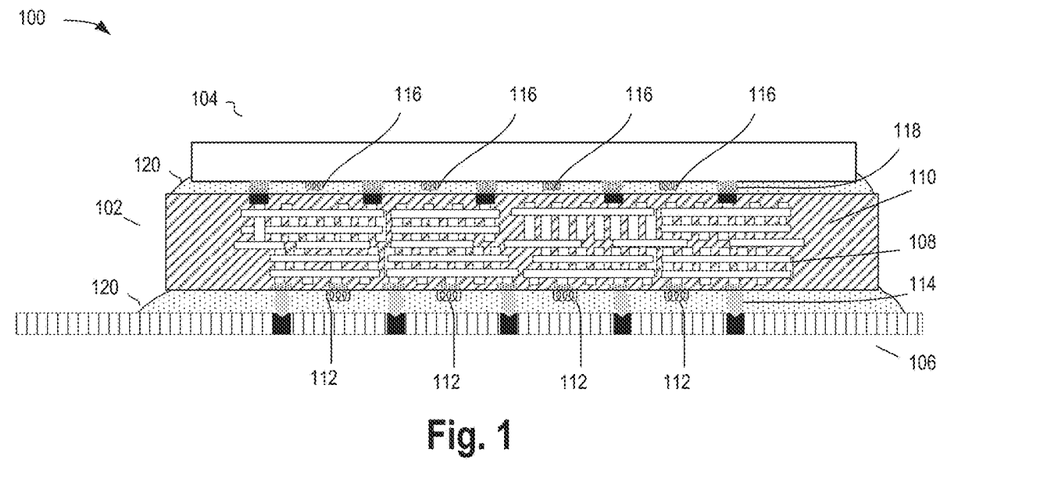
FIG. 1 illustrates a cross-sectional view of a system with a package with out-plane inductors, according to some embodiments.

FIG. 1 illustrates a cross-sectional view of a system with a package with out-plane inductors, according to some embodiments. As shown, system 100 includes package substrate 102, integrated circuit die 104, system board 106, conductive traces 108, dielectric material 110, substrate out-plane inductors 112, substrate solder contacts 114, die out-plane inductors 116, die solder contacts 118, and underfill material 120.

While shown as including a single die 104, system 100 can include multiple devices of similar or different types of integrated circuit devices. For example, die 104 can be any of application processors, graphics processors, field programmable gate arrays (FPGA), input/output (I/O) controllers, network controllers, or memory devices, among other devices. Die 104 is coupled with die solder contacts 118 on a top surface of package substrate 102. Substrate solder contacts 114 on a bottom surface of package substrate 102 (opposite of integrated circuit die 104) may enable package substrate 102 to be coupled with system board 106, which may include a printed circuit board, and may include ball grid array (BGA) or land grid array (LGA) contacts, for example.

Package substrate 102 may comprise a dielectric material 110 with conductive traces 108, for example vertical and horizontal copper, or other conductive material, disposed therein. Conductive traces 108 may couple die solder contacts 118 with substrate solder contacts 114, which may include solder balls, and transmit power, data and/or other signals. Underfill material 120, which may be an air cured epoxy, may be used to provide mechanical stability, for example, and may surround substrate out-plane inductors 112, substrate solder contacts 114, die out-plane inductors 116, and die solder contacts 118.

Substrate out-plane inductors 112 and die out-plane inductors 116 may be inductors formed on a surface of package substrate 102 and integrated circuit die 104, respectively, for example as shown in greater detail hereinafter. While shown as including both substrate out-plane inductors 112 and die out-plane inductors 116, in some embodiments system 100 may include one or the other or out-plane inductors on other surfaces. In some embodiments, substrate out-plane inductors 112 and die out-plane inductors 116 are situated between substrate solder contacts 114 and die solder contacts 118, respectively, to occupy space that would otherwise be unutilized.

Figure 2:
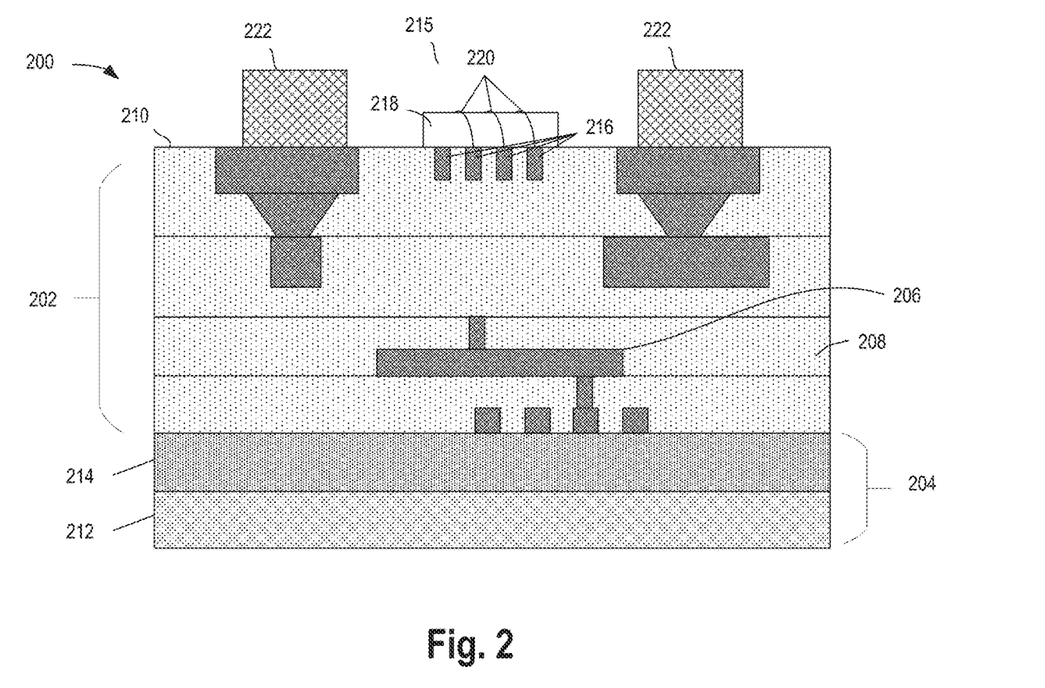
FIG. 2 illustrates a cross-sectional view of an integrated circuit device with an out-plane inductor, according to some embodiments.

FIG. 2 illustrates a cross-sectional view of an integrated circuit device with an out-plane inductor, according to some embodiments. As shown, device 200 includes interconnect layers 202, circuit substrate 204, metal 206, dielectric 208, dielectric surface 210, substrate 212, circuits 214, out-plane inductor 215, surface traces 216, magnetic material 218, bonding wires 220, and solder contacts 222.

Interconnect layers 202 may provide electrical connections between components of circuit substrate 204 and contacts 116, which may be lands, bumps, pins, etc., to couple device 200 with external substrates, interposers, packages, sockets, etc. Interconnect layers 202 may be formed iteratively on separate planes above circuit substrate 204. In some embodiments, interconnect layers 202 includes metal 206, such as copper, that may be plated into etched trenches and vias, then polished back to create metal trenches, planes, and vias, for example to communicate power and signals to and from circuit substrate 204. Metal 206 in interconnect layers 202 may be interspersed with dielectric 208, which has insulative properties. In some embodiments, dielectric 208 represents an interlayer dielectric (ILD) material, such as carbon doped oxide (CDO), deposited across metal 206 structures to a thickness at least equivalent to a thickness of an interconnect structure including wiring lines and subsequent level conductive vias.

Circuit substrate 204 may include integrated circuits in a circuits 214 layer on a substrate 212. In some embodiments, circuits 214 include semiconductor transistors, switches, gates, relays, and/or memory components. Circuits 214 may include millions of circuit devices or components that each include an input, an output, and/or a power signal communicated through interconnect layers 202. Substrate 212 may be made of silicon, other semiconductor material, and/or other non-semiconductor material.

Device 200 may include one or more out-plane inductors that may be formed on dielectric surface 210. Out-plane inductor 215 may extend perpendicularly from dielectric surface 210 and may include surface traces 216 and bonding wires 220 forming turns around magnetic material 218. While shown as including three turns, out-plane inductor 215 may include any number of turns. In some embodiments, the number, and height of bonding wires 220 coupling opposite ends of adjacent surface traces 216 may be at least partly based on the size and spacing of solder contacts 222. In some embodiments, bonding wires 220 may extend away from dielectric surface 210 to a distance of between about 20 and 60 um. While shown as including magnetic material 218, in some embodiments, out-plane inductor 215 may include an air core or a non-magnetic core. In some embodiments, magnetic material 218 may include a nickel iron alloy, a magnesium alloy, or other standalone metals or metal alloys, and may include doping such with zinc, for example.

Figure 3:
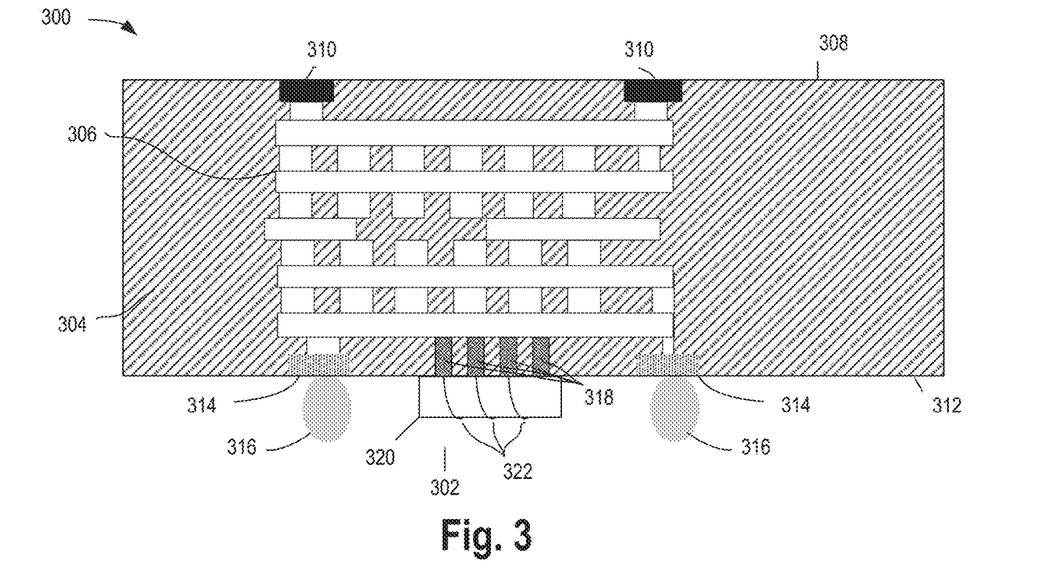
FIG. 3 illustrates a cross-sectional view of a package substrate with an out-plane inductor, according to some embodiments.

FIG. 3 illustrates a cross-sectional view of a package substrate with an out-plane inductor, according to some embodiments. As shown, substrate 300 includes out-plane inductor 302, dielectric 304, conductive traces 306, die-side surface 308, die-side contacts 310, dielectric surface 312, system-side contacts 314, solder contacts 316, surface traces 318, magnetic material 320, and bonding wires 322.

Substrate 300 may comprise a dielectric material 304 with conductive traces 306, for example vertical and horizontal copper, or other conductive material, disposed therein. Conductive traces 306 may couple die-side contacts 310 on die-side surface 308 with system-side contacts 314, and surface traces 318, on dielectric surface 312 to transmit power, data and/or other signals.

Substrate 300 may include one or more out-plane inductors 302 between solder contacts 316 extending from dielectric surface 312. Out-plane inductor 302 may include bonding wires 322 that loop around magnetic material 320 and bond opposite ends of adjacent surface traces 318. In some embodiments, bonding wires 322 are formed using conventional wirebonding techniques and may include metals such as copper, gold and silver, for example.

Figure 4:
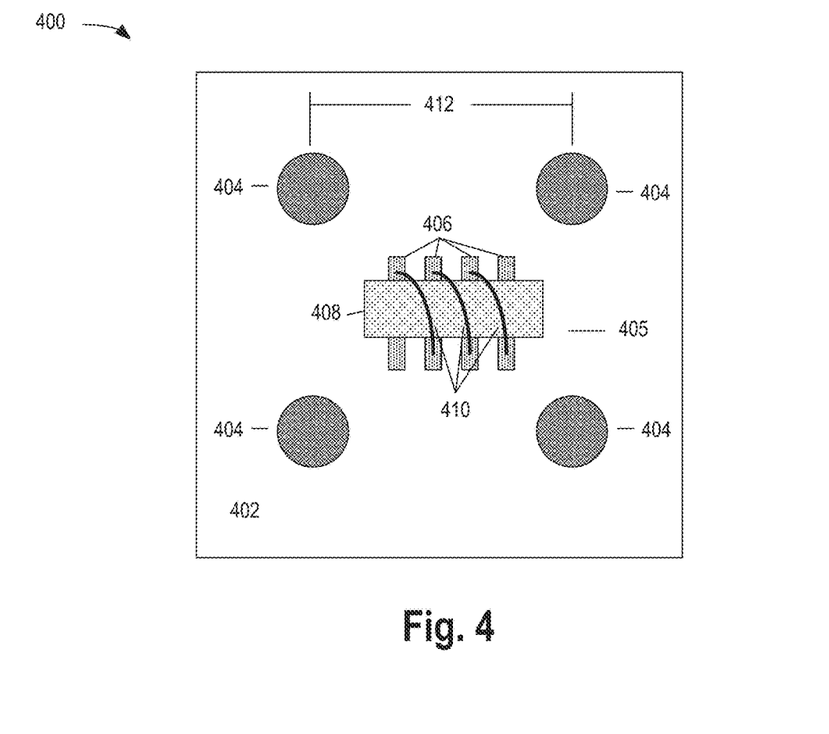
FIG. 4 illustrates an overhead view of a dielectric surface with an out-plane inductor, according to some embodiments.

FIG. 4 illustrates an overhead view of a dielectric surface with an out-plane inductor, according to some embodiments. As shown, package 400 includes dielectric surface 402, solder contacts 404, out-plane inductor 405, surface traces 406, magnetic material 408, bonding wires 410, and contact pitch 412.

Solder contacts 404, which may represent solder balls of a ball grid array (BGA) may be present at a contact pitch 412, which may be consistent or varying. In some embodiments, contact pitch 412 may range from about 200 to 400 um. Out-plane inductor 405 may include surface traces 406, magnetic material 408 and bonding wires 410 that loop arc over magnetic material 408 and couple opposite ends of adjacent surface traces 406. While shown as including linear, parallel surface traces 406, non-linear and/or non-parallel surface traces 406 may be included. For example, in some embodiments, surface traces 406 may be curved. While shown as including parallel bonding wires 410, non-parallel bonding wires 410 may be included. In some embodiments, a length of magnetic material 40$ may be based at least in part on contact pitch 412. In some embodiments, magnetic material 408 may have a length of between about 40 and 100 um.

Figure 5:
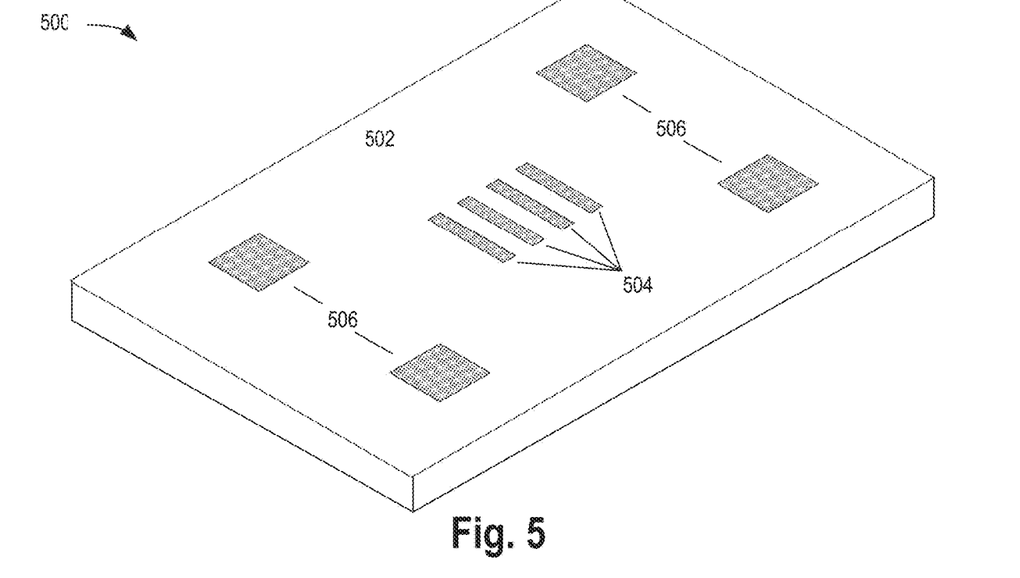
FIG. 5 illustrates an isometric view of a manufacturing step of a dielectric surface with an out-plane inductor, according to some embodiments.

FIG. 5 illustrates an isometric view of a manufacturing step of a dielectric surface with an out-plane inductor, according to some embodiments. As shown, assembly 500 includes dielectric surface 502, surface traces 504, and solder sites 506. Dielectric surface 502 may represent a substrate, interposer, integrated circuit device or other dielectric surface. In some embodiments, surface traces 504 and solder sites 506 are metal features within dielectric surface 502. While shown as being substantially alike, surface traces 504 may be include traces of different lengths, shapes and/or spacings.

Figure 6:
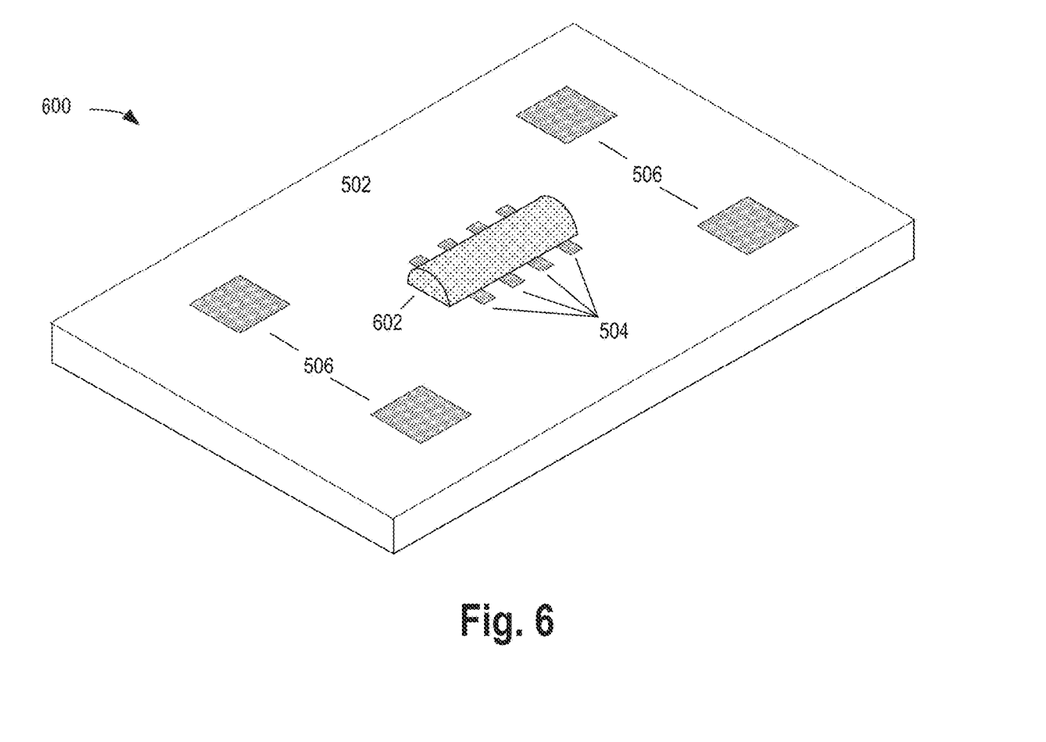
FIG. 6 illustrates an isometric view of a manufacturing step of a dielectric surface with an out-plane inductor, according to some embodiments.

FIG. 6 illustrates an isometric view of a manufacturing step of a dielectric surface with an out-plane inductor, according to some embodiments. As shown, assembly 600 includes magnetic material 602 that may have been disposed partially covering surface traces 504. Magnetic material 602 may represent nickel iron alloy and may have been deposited by flowing, electroplating, direct placement or other means. While shown as having a semi-cylindrical shape, magnetic material 602 may be any shape.

Figure 7:
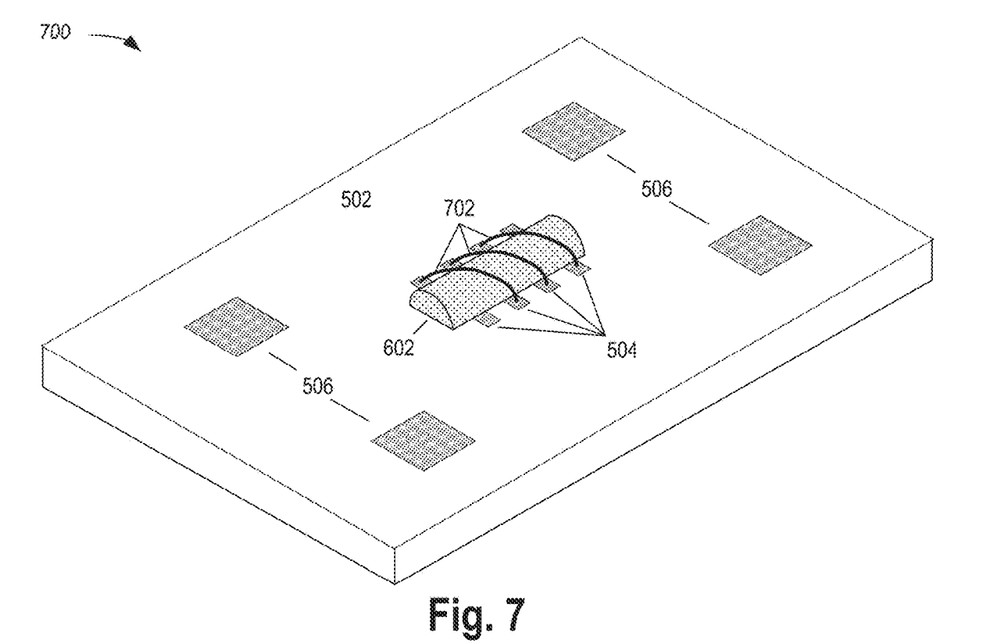
FIG. 7 illustrates an isometric view of a manufacturing step of a dielectric surface with an out-plane inductor, according to some embodiments.

FIG. 7 illustrates an isometric view of a manufacturing step of a dielectric surface with an out-plane inductor, according to some embodiments. As shown, assembly 700 includes bonding wires 702 arcing over magnetic material 602 and coupling opposite ends of adjacent surface traces 504. Bonding wires 702 may be formed using conventional wirebonding techniques and may include copper, gold, silver, or other metals. While shown as including three wire loops, in some embodiments, bonding wires 702 may include as few as one or as many as about twelve or more wire loops depending on the space available. While shown as extending away from dielectric surface 402 in an arc-like shape, bonding wires 702 may take any shape, including linear or curved, continuous or segmented shapes.

Figure 8:
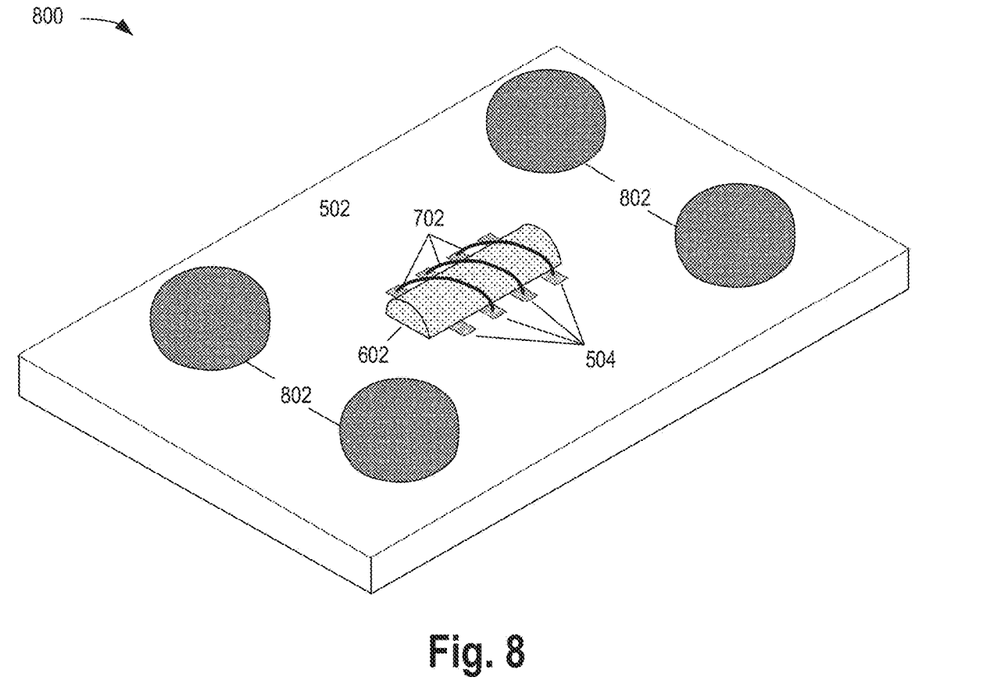
FIG. 8 illustrates an isometric view of a manufacturing step of a dielectric surface with an out-plane inductor, according to some embodiments.

FIG. 8 illustrates an isometric view of a manufacturing step of a dielectric surface with an out-plane inductor, according to some embodiments. As shown, assembly 800 includes solder contacts 802 that have been formed over solder sites 506. In some embodiments, solder contacts 802 may represent BGA's. Additional processing steps may be performed on assembly 800, for example to couple solder contacts 802 with a system board and/or to attach an integrated circuit device.

Figure 9:
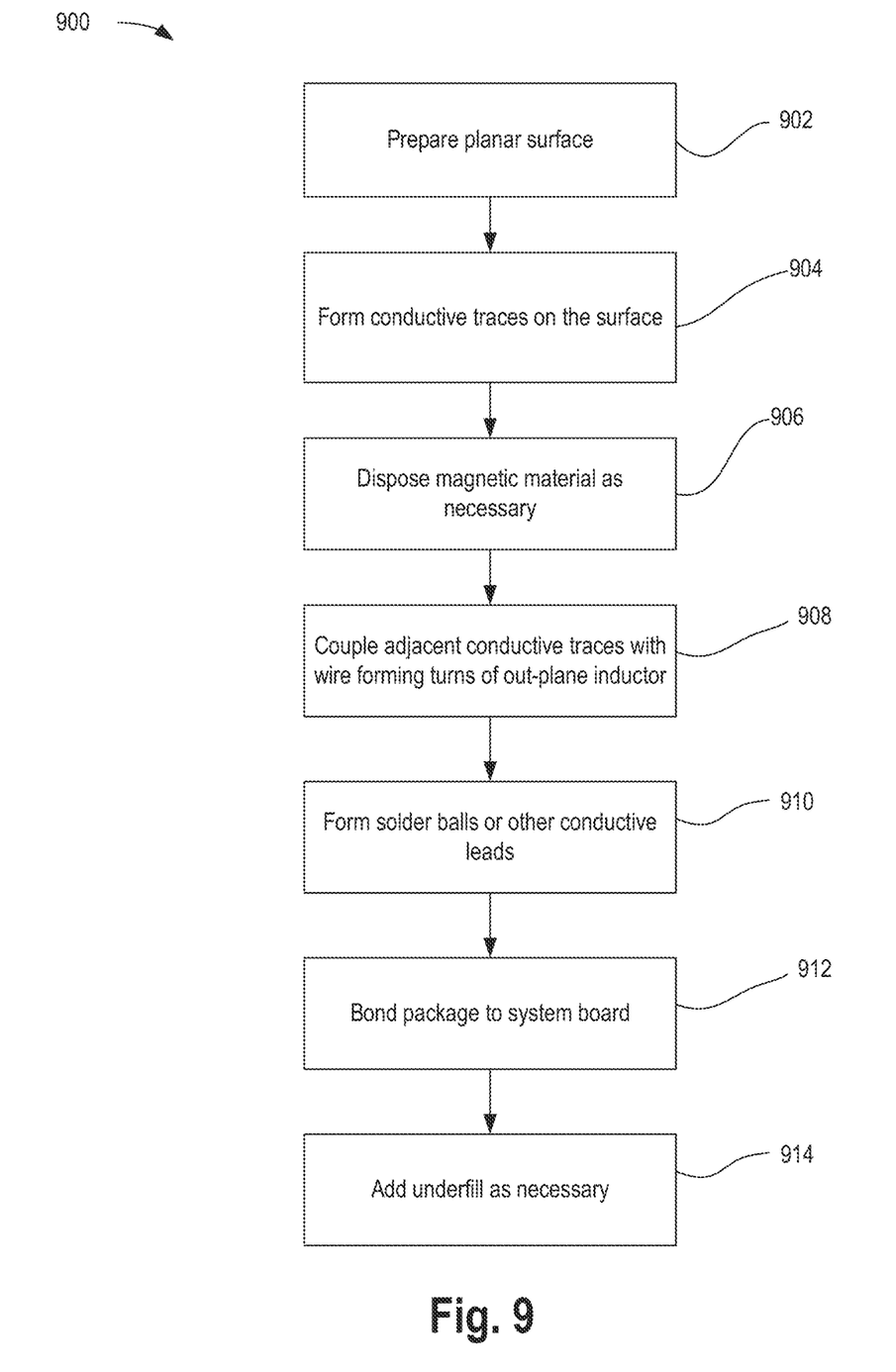
FIG. 9 illustrates a flowchart of a method of forming a package with out-plane inductors, in accordance with some embodiments.

FIG. 9 illustrates a flowchart of a method of forming a package with out-plane inductors, in accordance with some embodiments. Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 900 begins with preparing (902) a planar surface. In some embodiments, an integrated circuit device dielectric surface, such as dielectric surface 210 may be prepared. In some embodiments, a package substrate surface, such as dielectric surface 312 may be prepared.

Next, conductive traces are formed (904) on the surface. In some embodiments, surface traces, such as 216 or 318 may be formed on or in the surface. The conductive traces may be homogeneous or heterogeneous.

Then, magnetic material is disposed (906) as necessary. In some embodiments, magnetic material, such as 218 or 320, may be deposited at least partially covering one or more of the surface traces. In some embodiments, magnetic material is not used and instead an air gap may be present in the final out-plane inductor.

Next, adjacent conductive traces are coupled (908) with wire forming turns of an out-plane inductor. In some embodiments, the number of bonding wires (such as 220 or 322) are one less than the number of surface traces (such as 216 or 318). The method continues with forming (910) solder balls or other conductive leads. In some embodiments, multiple BGA solder balls are formed near different sides of the out-plane inductor.

Next, a package may be bonded (912) to a system board (such as 106). Finally, to the extent necessary, underfill (such as 120) may be added (914) under the package.

Figure 10:
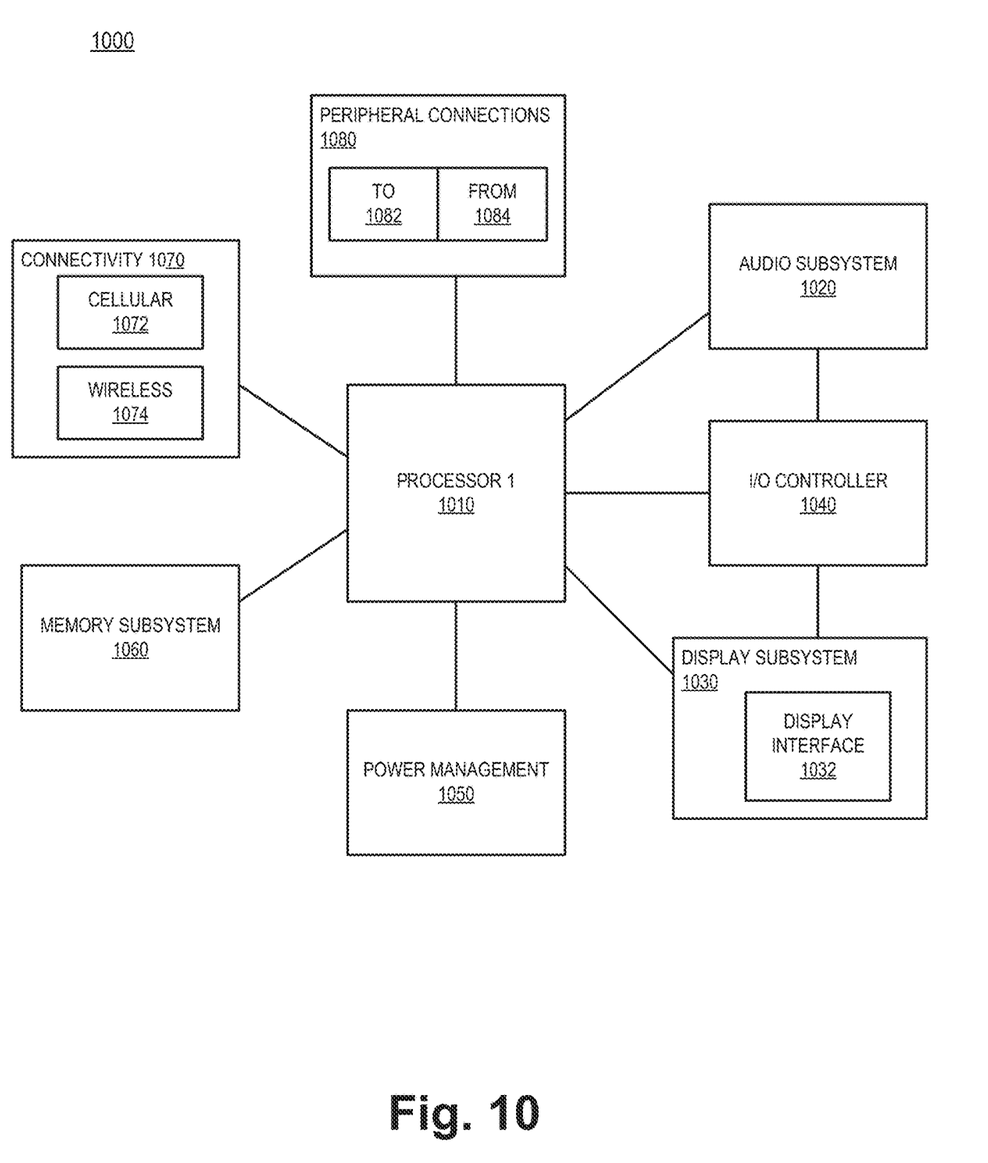
FIG. 10 illustrates a smart device or a computer system or a SoC (System-on-Chip) which includes a package with out-plane inductors, according to some embodiments.

FIG. 10 illustrates a smart device or a computer system or a SoC (System-on-Chip) 1000 which includes a package with out-plane inductors, according to some embodiments. In some embodiments, computing device 1000 represents a mobile computing device, such as a computing tablet, a mobile phone or smart-phone, a wireless-enabled e-reader, or other wireless mobile device. It will be understood that certain components are shown generally, and not all components of such a device are shown in computing device 1000. In some embodiments, one or more components of computing device 1000, for example processor 1010 and/or connectivity 1070, are included in a package with out-plane inductors as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 1000 includes a first processor 1010. The various embodiments of the present disclosure may also comprise a network interface within 1070 such as a wireless interface so that a system embodiment may be incorporated into a wireless device, for example, cell phone or personal digital assistant.

In one embodiment, processor 1010 can include one or more physical devices, such as microprocessors, application processors, microcontrollers, programmable logic devices, or other processing means. The processing operations performed by processor 1010 include the execution of an operating platform or operating system on which applications and/or device functions are executed. The processing operations include operations related to I/O (input/output) with a human user or with other devices, operations related to power management, and/or operations related to connecting the computing device 1000 to another device. The processing operations may also include operations related to audio I/O and/or display I/O.

In one embodiment, computing device 1000 includes audio subsystem 1020, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1000, or connected to the computing device 1000. In one embodiment, a user interacts with the computing device 1000 by providing audio commands that are received and processed by processor 1010.

Display subsystem 1030 represents hardware (e.g., display devices) and software (e.g., drivers) components that provide a visual and/or tactile display for a user to interact with the computing device 1000. Display subsystem 1030 includes display interface 1032, which includes the particular screen or hardware device used to provide a display to a user. In one embodiment, display interface 1032 includes logic separate from processor 1010 to perform at least some processing related to the display. In one embodiment, display subsystem 1030 includes a touch screen (or touch pad) device that provides both output and input to a user.

I/O controller 1040 represents hardware devices and software components related to interaction with a user. I/O controller 1040 is operable to manage hardware that is part of audio subsystem 1020 and/or display subsystem 1030. Additionally, I/O controller 1040 illustrates a connection point for additional devices that connect to computing device 1000 through which a user might interact with the system. For example, devices that can be attached to the computing device 1000 might include microphone devices, speaker or stereo systems, video systems or other display devices, keyboard or keypad devices, or other I/O devices for use with specific applications such as card readers or other devices.

As mentioned above, I/O controller 1040 can interact with audio subsystem 1020 and/or display subsystem 1030. For example, input through a microphone or other audio device can provide input or commands for one or more applications or functions of the computing device 1000. Additionally, audio output can be provided instead of, or in addition to display output. In another example, if display subsystem 1030 includes a touch screen, the display device also acts as an input device, which can be at least partially managed by I/O controller 1040. There can also be additional buttons or switches on the computing device 1000 to provide I/O functions managed by I/O controller 1040.

In one embodiment, I/O controller 1040 manages devices such as accelerometers, cameras, light sensors or other environmental sensors, or other hardware that can be included in the computing device 1000. The input can be part, of direct user interaction, as well as providing environmental input to the system to influence its operations (such as filtering for noise, adjusting displays for brightness detection, applying a flash for a camera, or other features).

In one embodiment, computing device 1000 includes power management 1050 that manages battery power usage, charging of the battery, and features related to power saving operation. Memory subsystem 1060 includes memory devices for storing information in computing device 1000. Memory can include nonvolatile (state does not change if power to the memory device is interrupted) and/or volatile (state is indeterminate if power to the memory device is interrupted) memory devices. Memory subsystem 1060 can store application data, user data, music, photos, documents, or other data, as well as system data (whether long-term or temporary) related to the execution of the applications and functions of the computing device 1000.

Elements of embodiments are also provided as a machine-readable medium (e.g., memory 1060) for storing the computer-executable instructions. The machine-readable medium (e.g., memory 1060) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1070 includes hardware devices (e.g., wireless and/or wired connectors and communication hardware) and software components (e.g., drivers, protocol stacks) to enable the computing device 1000 to communicate with external devices. The computing device 1000 could be separate devices, such as other computing devices, wireless access points or base stations, as well as peripherals such as headsets, printers, or other devices.

Connectivity 1070 can include multiple different types of connectivity. To generalize, the computing device 1000 is illustrated with cellular connectivity 1072 and wireless connectivity 1074. Cellular connectivity 1072 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1074 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1080 include hardware interfaces and connectors, as well as software components (e.g., drivers, protocol stacks) to make peripheral connections. It will be understood that the computing device 1000 could both be a peripheral device ("to" 1082) to other computing devices, as well as have peripheral devices ("from" 1084) connected to it. The computing device 1000 commonly has a "docking" connector to connect to other computing devices for purposes such as managing (e.g., downloading and/or uploading, changing, synchronizing) content on computing device 1000. Additionally, a docking connector can allow computing device 1000 to connect to certain peripherals that allow the computing device 1000 to control content output, for example, to audiovisual or other systems.

In addition to a proprietary docking connector or other proprietary connection hardware, the computing device 1000 can make peripheral connections 1080 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

In one example, an apparatus is provided comprising: a planar dielectric surface; two or more conductive leads on the surface, the conductive leads extending away from the substrate surface; two or more conductive traces on the surface between the conductive leads, the traces substantially parallel to each other; and a wire coupling a first end of a first conductive trace to an opposite end of an adjacent second conductive trace, the wire extending away from the surface.

Some embodiments also include a magnetic material on the surface at least partially between the conductive traces and the wire. In some embodiments, the magnetic material comprises a nickel iron alloy. Some embodiments also include a second wire coupling the second conductive trace to an adjacent third conductive trace, the second wire substantially parallel to the first wire, in some embodiments, the conductive leads comprise ball grid array (BGA) contacts. In some embodiments, the wire comprises a metal chosen from the group consisting of: copper, gold, and silver.

In another example, an apparatus is provided comprising: one or more integrated circuit die(s); and a substrate coupled with the die(s), wherein the substrate comprises: a planar dielectric surface; two or more conductive leads on the surface, the conductive leads extending away from the substrate surface; two or more conductive traces on the surface between the conductive leads, the traces substantially parallel to each other; a wire coupling a first end of a first conductive trace to an opposite end of an adjacent second conductive trace, the wire extending away from the surface in an arc-like shape; and a magnetic material on the surface at least partially between the conductive traces and the wire.

In some embodiments, the magnetic material comprises a nickel iron alloy. Some embodiments also include a second wire coupling the second conductive trace to an adjacent third conductive trace, the second wire substantially parallel to the first wire. Some embodiments also include three or more substantially parallel wires coupling opposite ends of adjacent conductive traces to form turns of an inductor. In some embodiments, the conductive leads comprise ball grid array (BGA) contacts. In some embodiments, the wire comprises a metal chosen from the group consisting of: copper, gold, and silver.

In another example, a system is provided comprising: a display subsystem; a wireless communication interface; and an integrated circuit package, the integrated circuit package comprising: one or more integrated circuit die(s); and a substrate coupled with the die(s), wherein the substrate comprises: a planar dielectric surface; two or more solder balls on the surface, the solder balls extending away from the substrate surface; two or more conductive traces on the surface between the solder balls, the traces substantially parallel to each other; and a wire coupling a first end of a first conductive trace to an opposite end of an adjacent second conductive trace, the wire extending away from the surface.

In some embodiments, the solder balls comprise a pitch spacing of between about 200 and 400 um. In some embodiments, the wire extends away from the surface to a distance of between about 20 and 60 um. Some embodiments also include a magnetic material on the surface at least partially between the conductive traces and the wire. In some embodiments, the wire comprises a metal chosen from the group consisting of: copper, gold, and silver. In some embodiments, the solder balls comprise ball grid array (BG) contacts.

In another example, a method is provided comprising: forming a planar dielectric surface; forming conductive leads on the surface, the conductive leads extending away from the substrate surface; forming two or more substantially parallel conductive traces within the surface, the conductive traces situated between the conductive leads; and forming a wire to couple a first end of a first conductive trace to an opposite end of an adjacent second conductive trace, the wire extending away from the surface in an arc-like shape.

Some embodiments also include depositing a magnetic material on the surface at least partially over the conductive traces. In some embodiments, depositing a magnetic material comprises depositing a nickel iron alloy. Some embodiments also include bonding the conductive contacts to a system board and forming mold underfill surrounding the wire and conductive contacts. Some embodiments also include forming multiple parallel wires coupling opposite ends of adjacent conductive traces. In some embodiments, forming the wire comprises performing a wirebonding process. In some embodiments, forming the conductive leads comprises forming BGA contacts.

In another example, an integrated circuit device package substrate is provided comprising: a plurality of solder means on a substrate surface for coupling the substrate with a printed circuit board, the solder means extending away from the substrate surface; a plurality of conductive means on the substrate surface, the conductive means substantially parallel to each other; and means for bonding a first end of a first conductive means to an opposite end of an adjacent second conductive means, the bonding means extending away from the substrate surface.

Some embodiments also include a magnetic means on the substrate surface at least partially between the conductive means and the bonding means. In some embodiments, the magnetic means comprises a nickel iron alloy. Some embodiments also include a means for bonding the second conductive means to an adjacent third conductive means, the second bonding means substantially parallel to the first bonding means. In some embodiments, the solder means comprise ball grid array (BGA) contacts. In some embodiments, the bonding means comprises an arc-like shape. In some embodiments, the bonding means comprises a metal chosen from the group consisting of: copper, gold, and silver.

In another example, a wireless communication system is provided comprising: a processor; a display subsystem; and a wireless communication interface, the wireless communication interface comprising an integrated circuit package comprising: one or more integrated circuit die(s); and a substrate coupled with the die(s), wherein the substrate comprises: a planar dielectric surface; two or more solder balls on the surface, the solder balls extending away from the substrate surface; two or more conductive traces on the surface between the solder balls, the traces substantially parallel to each other; and a wire coupling a first end of a first conductive trace to an opposite end of an adjacent second conductive trace, the wire extending away from the surface.

In some embodiments, the solder balls comprise a pitch spacing of between about 200 and 400 um. In some embodiments, the wire extends away from the surface to a distance of between about 20 and 60 um. Some embodiments also include a magnetic material on the surface at least partially between the conductive traces and the wire. In some embodiments, the wire comprises a metal chosen from the group consisting of: copper, gold, and silver. In some embodiments, the wire comprises an arc-like shape. In some embodiments, the solder balls comprise ball grid array (BGA) contacts An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   one or more integrated circuit die(s); and
   a substrate coupled with the die(s), wherein the substrate comprises:
      a planar dielectric surface;
      two or more conductive leads on the surface, the conductive leads extending away from the planar dielectric surface;
      two or more conductive traces on the surface between the conductive leads, the traces parallel to each other, wherein at least one of the two or more conductive leads and at least one of the two or more conductive traces are conductively coupled to each other through horizontal and vertical copper traces disposed within the substrate;
      a wire coupling a first end of a first conductive trace of the two or more conductive traces to an opposite end of an adjacent second conductive trace of the two or more conductive traces, the wire extending away from the surface in an arc-like shape; and
      a magnetic material on the surface at least partially between the conductive traces and the wire.

2. The apparatus of claim 1, wherein the magnetic material comprises a nickel iron alloy.

3. The apparatus of claim 1, further comprising a second wire coupling the second conductive trace of the two or more conductive traces to an adjacent third conductive trace of the two or more conductive traces, the second wire parallel to the first wire.

4. The apparatus of claim 1, further comprising three or more parallel wires coupling opposite ends of adjacent conductive traces to form turns of an inductor.

5. The apparatus of claim 1, wherein the conductive leads comprise ball grid array (BGA) contacts.

6. The apparatus of claim 1, wherein the wire comprises a metal chosen from the group consisting of: copper, gold, and silver.

7. A system comprising:
   a display subsystem;
   a wireless communication interface; and
   an integrated circuit package, the integrated circuit package comprising:
      one or more integrated circuit die(s); and
      a substrate coupled with the die(s), wherein the substrate comprises:
         a planar dielectric surface;
         two or more solder balls on the surface, the solder balls extending away from the planar dielectric surface;
         two or more conductive traces on the surface between the solder balls, the traces parallel to each other, wherein at least one of the two or more solder balls and at least one of the two or more conductive traces are conductively coupled to each other through horizontal and vertical copper traces disposed within the substrate; and
         a wire coupling a first end of a first conductive trace to an opposite end of an adjacent second conductive trace, the wire extending away from the surface.

8. The system of claim 7, wherein the solder balls comprise a pitch spacing of between about 200 and 400 um.

9. The system of claim 8, wherein the wire extends away from the planar dielectric surface to a distance of between about 20 and 60 um.

10. The system of claim 7, further comprising a magnetic material on the planar dielectric surface at least partially between the conductive traces and the wire.

11. The system of claim 7, wherein the wire comprises a metal chosen from the group consisting of: copper, gold, and silver.

12. The system of claim 7, wherein the solder balls comprise ball grid array (BGA) contacts.

13. A method comprising:
  forming a planar dielectric surface;
  forming conductive leads on the planar dielectric surface, the conductive leads extending away from the planar dielectric surface;
  forming two or more parallel conductive traces within the planar dielectric surface, the conductive traces situated between the conductive leads;
  forming horizontal and vertical copper traces within the substrate to conductively couple at least one of the conductive leads with at least one of the two or more conductive parallel traces; and
  forming a wire to couple a first end of a first conductive trace of the two or more parallel conductive traces to an opposite end of an adjacent second conductive trace of the two or more parallel conductive traces, the wire extending away from the surface in an arc-like shape.

14. The method of claim 13, further comprising depositing a magnetic material on the planar dielectric surface at least partially over the conductive traces.

15. The method of claim 14, wherein depositing a magnetic material comprises depositing a nickel iron alloy.

16. The method of claim 13, further comprising bonding the conductive leads to a system board and forming mold underfill surrounding the wire and conductive leads.

17. The method of claim 13, further comprising forming multiple parallel wires coupling opposite ends of adjacent conductive traces of the two or more parallel conductive traces.

18. The method of claim 13, wherein forming the wire comprises performing a wirebonding process.

19. The method of claim 13, wherein forming the conductive leads comprises forming BGA contacts.

* * * * *